United States Patent [19]

Aichelmann, Jr. et al.

[11] 4,365,318

[45] Dec. 21, 1982

[54] TWO SPEED RECIRCULATING MEMORY SYSTEM USING PARTIALLY GOOD COMPONENTS

[75] Inventors: Frederick J. Aichelmann, Jr.; Bruce E. Bachman, both of Hopewell Junction, N.Y.

[73] Assignee: International Business Machines Corp., Armonk, N.Y.

[21] Appl. No.: 187,254

[22] Filed: Sep. 15, 1980

[51] Int. Cl.³ .......................... G11C 7/00; G11C 21/00
[52] U.S. Cl. ..................................... 365/200; 365/73; 371/10; 371/11
[58] Field of Search ..................... 365/73, 200; 371/10, 371/11

[56] References Cited

U.S. PATENT DOCUMENTS

| | | | |
|---|---|---|---|
| 3,654,610 | 4/1972 | Sander et al. | 340/172.5 |
| 3,755,791 | 8/1973 | Arzubi | 340/173 R |
| 3,765,001 | 10/1973 | Beausoleil | 340/173 R |
| 3,781,826 | 12/1973 | Beausoleil | 340/173 R |
| 3,845,476 | 10/1974 | Boehm | 340/173 BB |
| 3,976,179 | 10/1976 | Elmer et al. | 340/173 BB |
| 4,066,880 | 1/1978 | Salley | 235/302.3 |
| 4,089,063 | 5/1978 | Takezono | 365/200 |

*Primary Examiner*—George G. Stellar
*Attorney, Agent, or Firm*—Robert J. Haase

[57] ABSTRACT

A CCD recirculating memory system is disclosed in which "partially good" CCD memory chips and "all good" memory chips are mounted on memory cards. The defective portions of the partially good chips are in the same chip octants on the same card. The cards are addressed by address permutation means which causes the defective portions to appear to have the same predetermined address to the operating system.

The addressed CCD row on the partially good chips are clocked at a fast rate while the unaddressed rows are clocked at a slow rate. All of the rows of the "all good" chips are clocked at a fast rate when a defective portion of the partially good chips is being addressed and are otherwise clocked at a slow rate.

A select signal is generated whenever the predetermined address is invoked and causes the substitution of an all good chip for the addressed partially good chip. The select signal also selectively prevents another memory access from occurring until resynchronization is achieved between the last accessed chip and the unaccessed chips. The arrangement minimizes waiting time between successive memory accesses in a two speed partially good recirculating array without the need to map and store the defective locations on the partially good chips employed.

8 Claims, 5 Drawing Figures

| ABC MATCH PENDING AND CURRENT ADDRESSES (LINE 109) | XYZ INCOMING PENDING ADDRESS REQUEST (LINE 44) | S CURRENT ADDRESS (LINE 12) | INHIBIT SIGNAL (LINE 120) | MICRO PROCESS INTERPRETATION |
|---|---|---|---|---|
| ACTIVE | ACTIVE | NOT ACTIVE | ACTIVE | DO NOT OPERATE ON PENDING ADDRESS UNTIL CATCH UP COMPLETE |
| ACTIVE | NOT ACTIVE | ACTIVE | ACTIVE | DITTO |

TWO SPEED RECIRCULATING MEMORY SYSTEM USING PARTIALLY GOOD COMPONENTS

BACKGROUND OF THE INVENTION

1. Field of the Invention

The present invention generally relates to memory systems utilizing memory components of the recirculating type which are operated selectively at fast and slow recirculating rates and, more particularly to such systems implemented with so called "partially good" memory components.

2. Description of the Prior Art

Memory systems of the recirculating type, for example, of the charge coupled device type, are well known. In an effort to minimize power dissipation of such memory systems, particularly where large numbers of memory cells are used in the same high density integrated circuit chips, only those chips selected for reading or writing purposes are recirculated at high rates. The unselected chips, at any given time, are recirculated at lower rates, consistent with data retention requirements, to minimize power dissipation and the associated chip cooling problems.

One concern that arises in the aforementioned memory systems is the avoidance of a reduction in the overall memory availability time. Due to the different recirculating rates of the selected and unselected memory components, said two components loose synchronization relative to each other with the selected devices undergoing a complete cycle of recirculation during the same time that the unselected devices undergo only a partial cycle of recirculation. It becomes necessary to provide additional time, after the selection mode (for reading or writing) has been completed to restore synchronization. Synchronization is regained by permitting the previously selected devices to continue to recirculate at a high rate until they "lap" (so to speak) the unselected devices and once again become time synchronized thereto. At that time, all devices are recirculated at the same low speed until the next memory access (selection mode) is desired. The next access can be postponed until resynchronization is achieved between all memory devices.

Alternatively, in order to increase the availability of the memory to a series of accesses, provision can be made for initiating a second access promptly following completion of the first access and without waiting for synchronization to be regained between the selected and unselected devices. This is made possible by the fact that the time phases of all the selected and non selected recirculating devices is known at all times. Therefore, access to a previously unselected device can be made promptly following completion of access to a selected device by keeping track of the known time phase of the recirculating bits of the former device upon completion of access to the latter device.

A further and more difficult problem arises when the memory system just described is implemented with "partially good" components (memory devices). Memory systems employing partially good components are described in U.S. Pat. Nos. 3,765,001, William F. Beausoleil, Issued Oct. 9, 1973, 3,781,826, William F. Beausoleil, Issued Dec. 25, 1973, and 3,845,476, Robert Francis Boehm, Issued Oct. 29, 1974, and assigned to the present assignee.

When a defective portion of a "partially good" component is addressed, it is replaced by a spare "all good" component which is provided for that purpose. Different portions of the same spare "all good" component can be used to replace the defective portions of many different "partially good" components. All portions of the "all good" spare components are always operated solely at the same recirculation rate. The entire "all good" chip is driven at a high clock rate when any portion thereof is selected. The entire "all good" chip is driven at a low clock rate when no portion thereof is selected. Thus, when the spare portion associated with one defective portion is driven at a high recirculation rate, the spare portion associated with all other defective portions are driven at the same high rate. In order to start a second memory access before "catch up" is completed following a first access, it would be necessary to map and store a listing of all the "partially good" components and which portion of each is defective. Such a mapping would constitute a considerable logic and storage investment.

SUMMARY OF THE INVENTION

A two speed recirculating memory system is provided utilizing "partially good" components (chips) characterized by permitting a second memory access promptly upon completing a first memory access in most cases and without requiring storage of data representing the locations of the defective portions of the partially good components. The chips are sorted and mounted on memory array cards so that each card has mounted thereon sets of partially good chips having defective portions in the same sectors as well as all good chips having no defective portions. Translation logic is provided on each card whereby an address signal which corresponds to the address of a defective chip sector is translated to an address of an all-good chip. Additionally, programmable means is mounted on each array card to allow sets of chips having defects in a different sector to be placed on different array cards whereby the same predetermined sector appears defective to the memory control system irrespective of which sectors actually are defective on the respective cards.

Comparison means are provided in the memory control system to recognize each instance in which the predetermined sector is being addressed and, in those instances only, to generate a signal which selectively inhibits a second memory access which is begun prior to the completion of the "catch up" phase following a previous access. The inhibit signal preferably is applied to prevent an overlapping memory access in the case where the next access is to be made into a defective sector from a non-defective sector, or vice-versa, of the same chip involved in the previous access.

DESCRIPTION OF THE PREFERRED EMBODIMENT

Figure 1:
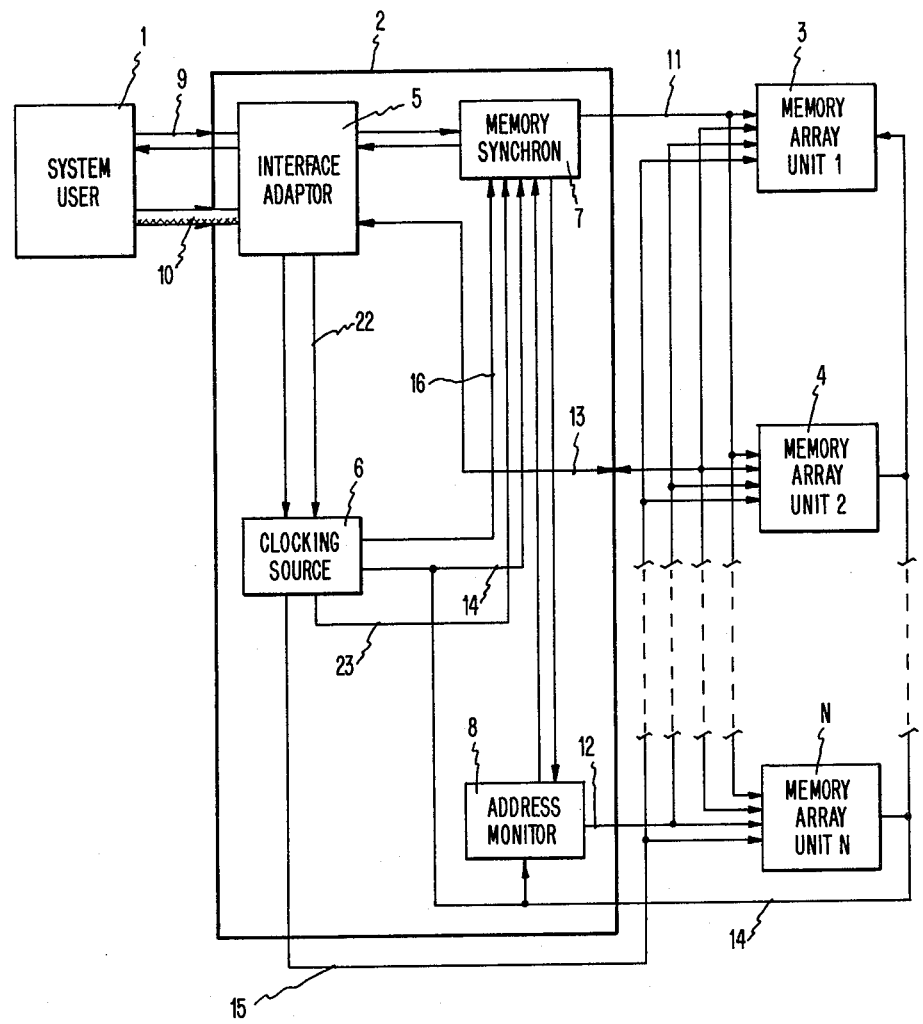
FIG. 1 is a simplified overall block diagram of a memory system in accordance with the present invention.

FIG. 1 is a simplified block diagram of the memory system of the present invention. Only those features which are associated with the addressing and timing control of the memory arrays units are emphasized. State-of-the-art features not uniquely associated with the present invention are not shown for the sake of simplicity and clarity of exposition. The memory system comprises a system user 1 which is coupled via memory controller 2 to a plurality of memory components or memory array units 3, 4 . . . N. The memory array units typically are large scale integration semiconductor chips containing memory elements of the recirculating type such as charge coupled device loops. Memory controller 2 comprises interface adapter 5, clocking source 6, memory synchronizer 7 and address monitor 8. The interface adapter 5 receives control signals via bus 9 and data and address signals via bus 10 from system user 1 and, in turn, generates the appropriate select signals and other signals which are required for the reading, writing or data recirculating operations required by the memory array units. In addition, memory controller 2 provides the basic clock signals to allow the memory unit to be accessed at relatively fast clocking rates, to be placed into a power-saving standby mode at relatively low clocking rates, to accomplish resynchronization between accessed portions and non-accessed portions of the memory array unit following a memory access, and to permit the simultaneous resynchronization of previously accessed and non-accessed memory units while undertaking a subsequent access operation.

Each of the memory array units 3, 4 . . . N, in accordance with the present invention, are implemented with "partially good" large scale integration chips. After manufacture, the chips are tested and sorted in accordance with the location of the defection portions thereof. Chips having defective areas in the same physical location are mounted on the same memory array unit card. For this purpose, it is convenient to subdivide the surface area of each chip into ⅛ portions, each portion being termed an octant. Chips having defects in the same octant are mounted on the same memory card.

Each of the memory array units 3, 4 . . . N receive address bits via bus 11 and A and B gating signals (to be described later) from memory synchronizer 7. Each memory array unit further receives a selector signal on line 12 at the output of address monitor 8 each time that the system user attempts to address a defective octant on one of the array cards. Data is transmitted between the memory array cards and interface adapter 5 via line 13. Finally, each of the array cards receives fast clocks and a masking signal via lines 14 and 15, respectively from clocking source 6. The masking signals are gating signals coinciding with the slow clocks generated within source 6. Slow and fast clocks are applied to memory control and synchronizer 7 via lines 16 and 14.

Figure 2:
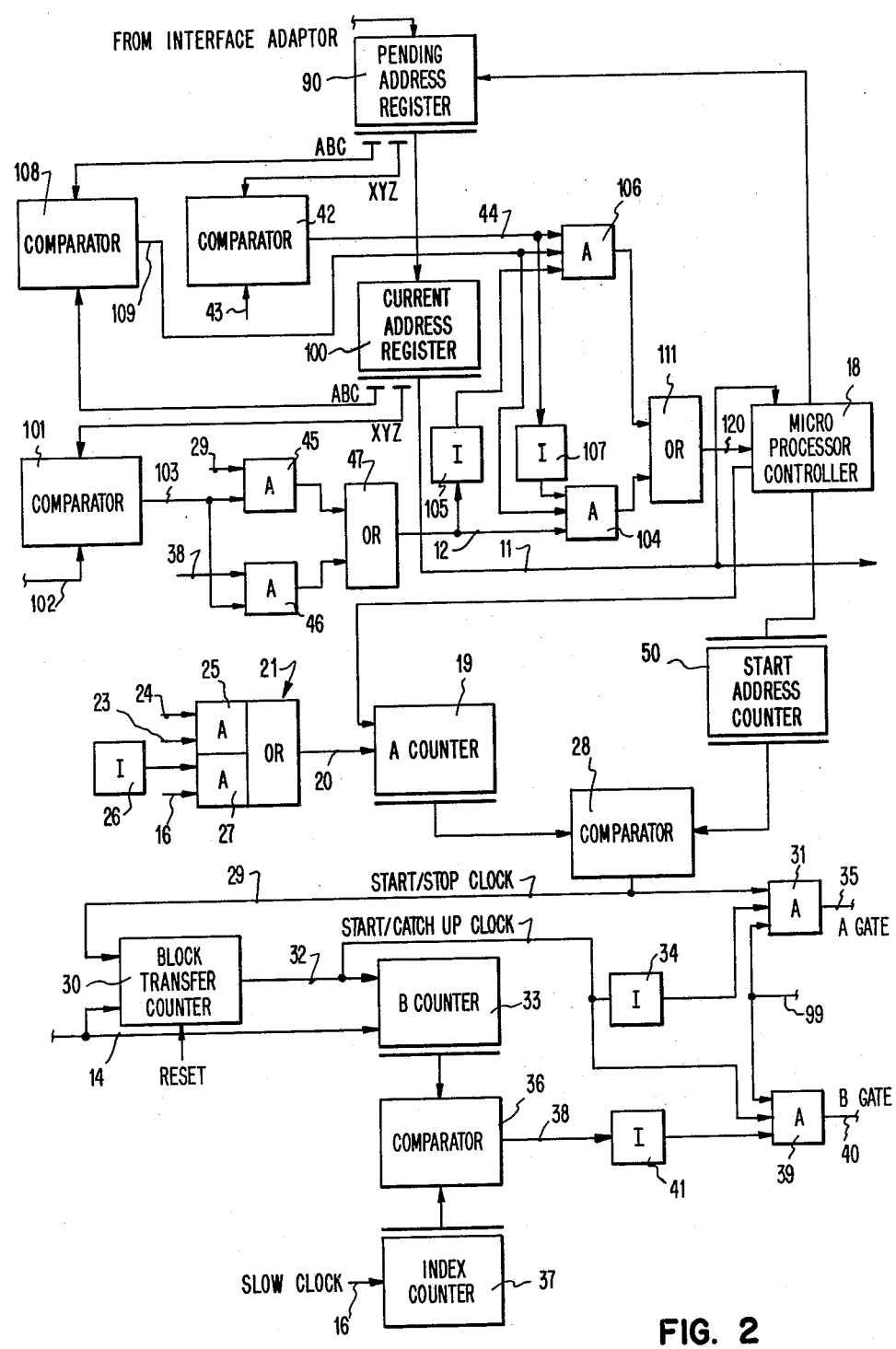
FIG. 2 is a simplified block diagram showing the memory control and memory monitor components of FIG. 1 in more detail.
Figures 3, 4:
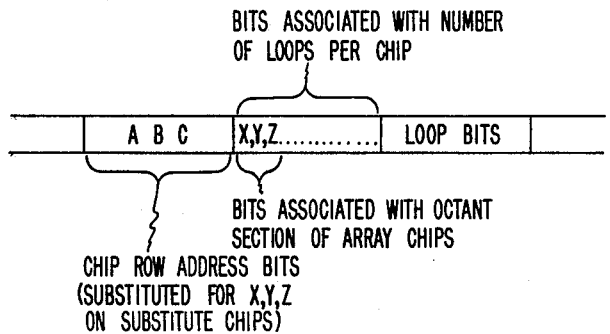
FIG. 3 is a sketch representing a portion of the address data format employed.
FIG. 4 is a truth table representing the operation of the fetch inhibition logic of the components of FIG. 2.

Memory synchronizer 7 and address monitor 8 of FIG. 1 are represented by the simplified block diagram of FIG. 2. The memory synchronizer receives an address from interface adapter 5 which address is loaded into pending address register 90. The address is read out of register 90 thru register 100 and is transmitted via bus 11 to the memory array units 3, 4 . . . N for selection of the memory unit. The addressing scheme is shown in FIG. 3. In particular, 6 of the bits of the address located in registers 90 and 100, represented by bits A, B and C and bits x, y and z are utilized in addressing the memory array units. Bits A, B and C select the chip rows whereas bits x, y and z represent the octant of the chips being addressed within the memory array units. As will be seen later, bits A, B and C are substituted for bits x, y and z in the case where a defective octant is being addressed within the partially good chips comprising the memory array units. By means of personalized connections to each of the memory array units, the octant addressing bits x, y and z are permutated, if necessary, in order that the defective octants of all the chips in any given memory array unit is addressed when each of the bits x, y and z is a binary one. This will be discussed in connection with FIG. 5 to be described later.

Returning to FIG. 2, the address read out of register 100 also is applied to microprocessor controller 18 which computes an address representing the position of the recirculating bits within each of the address chips at a predetermined future time when access is to be made for reading or writing purposes. The position of the recirculating bits of the address chip is represented by the count in counter 19 which is selectively driven either by the slow clocks or by the fast clocks applied via line 20 at the output of AND-OR gates 21. Counter 19, like the addressed recirculating loop, is driven by slow clock pulses during the time that the recirculating loop is in the standby or low power mode. Counter 19, like the addressed recirculating loop, is driven by fast clock pulses during the time that the recirculating loop is operating in the access mode for reading or writing purposes. A signal indicating that access is to be made is provided by interface adapter 5 of FIG. 1 via line 22 to clocking source 6. Clocking source 6, in turn, provides the access signal as well as the slow and fast clocks by lines 23, 16 and 14 to the memory synchronizer shown in FIG. 2. The access signal is directly applied to AND gate 25 of gate 21 and by means of inverter 26 to AND gate 27. Accordingly, the fast clock pulses are applied via gates 25 to line 20 during the select mode while the slow clock pulses are applied by gate 27 to line 20 during the remainder of the time.

The address computed by microprocessor 18 is stored within counter 50 and is compared within comparator 28 with the count in counter 19 to provide a "start clock" signal on line 29 when the two counts are equal. The signal on line 29 is jointly applied to counter 30 and to AND gates 31 and 45.

Counter 30 is preset to a count equalling the number of bits to be transferred during the accessing of the addressed memory loop. The count in counter 30 is decremented at the fast clock rate until the count reduces to zero indicating that the desired data transfer has been completed. A "start catch up" signal is generated on line 32 indicating that the data transfer has been completed and is applied jointly to counter 33, inverter 34 and AND gate 39. The output from inverter 34 is applied to a second input to AND gate 31. AND gate 31 also receives the $\overline{S}$ signal on line 99 signifying that a defective octant is not being addressed. AND gate 31 is conditioned by the $\overline{S}$ signal to conduct to produce the A gate signal on line 35 during the interval between the initiation of signals from comparator 28 and from counter 30, respectively, i.e., during the time of the data transfer.

As was previously stated, the recirculating memory components comprising array units 3, 4 . . . N are driven by slow clock pulses during the standby mode in order to conserve power and to minimize corresponding heat dissipation problems. The memory components are driven by high frequency clock pulses, during the time that they are being accessed, to reduce accessing time. Accordingly, upon the completion of accessing to an addressed memory component, the previously unaccessed memory components are out of synchronization with the addressed components. In order to restore synchronization between the accessed and the unaccessed components, the previously accessed component continues to be driven by the fast clock pulses until such time that it "catches up" to (or overtakes) the unaccessed components which continue to be driven by the slow clock pulses.

Counter 33 begins counting from zero immediately upon the completion of a previous memory access. The count in counter 33 is compared in comparator 36 with the count in counter 37. Counter 37 is driven by the slow clock pulses of line 16 so that the count in counter 37 represents the position of the recirculating bits in the unaccessed memory components. Similarly, the count in counter 33 represents the position of the recirculating bits in the previously accessed memory components which is now continuing to be driven by the fast clock pulses in order to achieve "catch up". The counts in counters 33 and 37 become equal when synchronization is restored between the previously accessed memory components and the previously unaccessed memory components and produces a "stop catch up" signal on line 38 representing that condition.

The initiation of a signal on line 32 at the output of counter 30, at the start of the "catch up" interval, and the $\overline{S}$ signal on line 99 condition AND gate 39 for conduction to produce a signal on line 40 indicating the commencement of "catch up". The initiation of a signal on line 38 at the output of comparator 36, representing the completion of the "catch up" mode, prevents AND gate 39 from further conduction in as much as the signal on line 38 is inverted (41) prior to application to AND gate 39. Thus, the memory control and synchronizer shown in FIG. 2 produces a gating signal on line 35 (designated A gate) during the time that a memory component is being accessed and a gating signal on line 40 (designated B gate) during the time that the accessed memory elements and the unaccessed memory elements are being resynchronized to each other. Both the A and B gates are produced only if no defective octant is being addressed.

Provision is made in the memory array unit for the substitution of "all good" chips whenever a defective octant of a "partially good" chip is being accessed. As will be seen, all rows of the "all good" chips are driven at the same fast clock rate if any row is selected or at the same slow clock rate if no row is selected. Accordingly, the time phase between the recirculating bits of an accessed memory component and the recirculating bits of an unaccessed recirculating component depends upon whether the recirculating bits of the unaccessed components are within the "good" portion or within the "defective" portion of the "partially good" chip containing both portions. This is true because an all good chip is substituted for a partially good chip whenever a defective portion of a partially good chip is being addressed.

Keeping in mind that each of the array units may contain chips having defective portions in different octants, it normally would be necessary to store in memory the locations of these defective portions for each of the memory units in order that resynchronization can be achieved between the accessed and unaccessed components independent of which card is being addressed at a given time. This problem is avoided, in accordance with the present invention, by the technique of making the addresses of the defective portions of all of the partially good components appear to be the same standard address to the system user. Simply by monitoring the addresses of the memory components being accessed and detecting the occasion when the standard address is being called for, either in only the current address or in only the next (pending) address, a signal is generated which selectively inhibits the next memory fetch until after resynchronization has been achieved between the last accessed and the unaccessed memory components. Such inhibition occurs only in the case where the next memory access is to be made into a defective octant from a non defective octant, or vice-versa, of the same memory chip involved in the last proceding memory access. The next access is permitted to occur immediately following completion of the preceding access in all other cases. The next memory fetch is inhibited by directing microprocessor controller 18 to delay the transfer of the pending address from register 90 into the current address register 104 until "catch up" has been completed. In the absence of the inhibit signal, the next memory fetch begins upon completion of the current data transfer.

The conditions which cause the next memory fetch to be delayed are summarized in the truth table of FIG. 4. The manner in which the inhibit signal is generated can be understood by reference to FIG. 2. Three of the bits stored in current address register 100, namely the x, y and z bits, are routed to comparator 101 which also receives a set of signals all having the binary value one on lines 102. As will be described later, provision is made for transforming the addresses of the defective portions of the partially good components so that all such addresses appear to be the same standard address. For convenience, the standard address is defined to be three "ones". A match is achieved in comparator 101 whenever the defective portion of any memory component is being addressed and a signal is produced on output line 103. The signal on line 103 is applied jointly to AND gates 45 and 46. AND gate 45 also receives the "start clock" signal on line 29 coinciding with the initiation of the A gate. AND gate 46 also receives the B "stop catch up" signal on line 38. The outputs of gates 45 and 46 are applied to OR circuit 47 which, in turn, produces a select signal S on output line 12. The S signal is applied directly to AND gate 104 and, via inverter 105, to AND gate 106. In an analogous fashion, the x, y and z bits of the pending address in register 90 are compared (42) against a set of all binary "one" bits on line 43 to produce a signal on line 44 which is directly applied to AND gate 106 and, via inverter 107, to AND gate 104. Lastly, the A, B, and C bits (representing chip address) from the pending and the current addresses in registers 90 and 100, respectively, are compared (108) to provide a signal on line 109. The signal on line 109, which is "active" if the compared chip addresses are the same, is applied jointly to AND gates 106 and 104. It will be seen that AND gate 106 performs the function described in row I of the truth table of FIG. 4 while AND gate 104 performs the function of row II to provide an inhibit signal on line 120 at the output of OR circuit 111 which receives its inputs from AND circuits 106 and 104.

Figure 5:
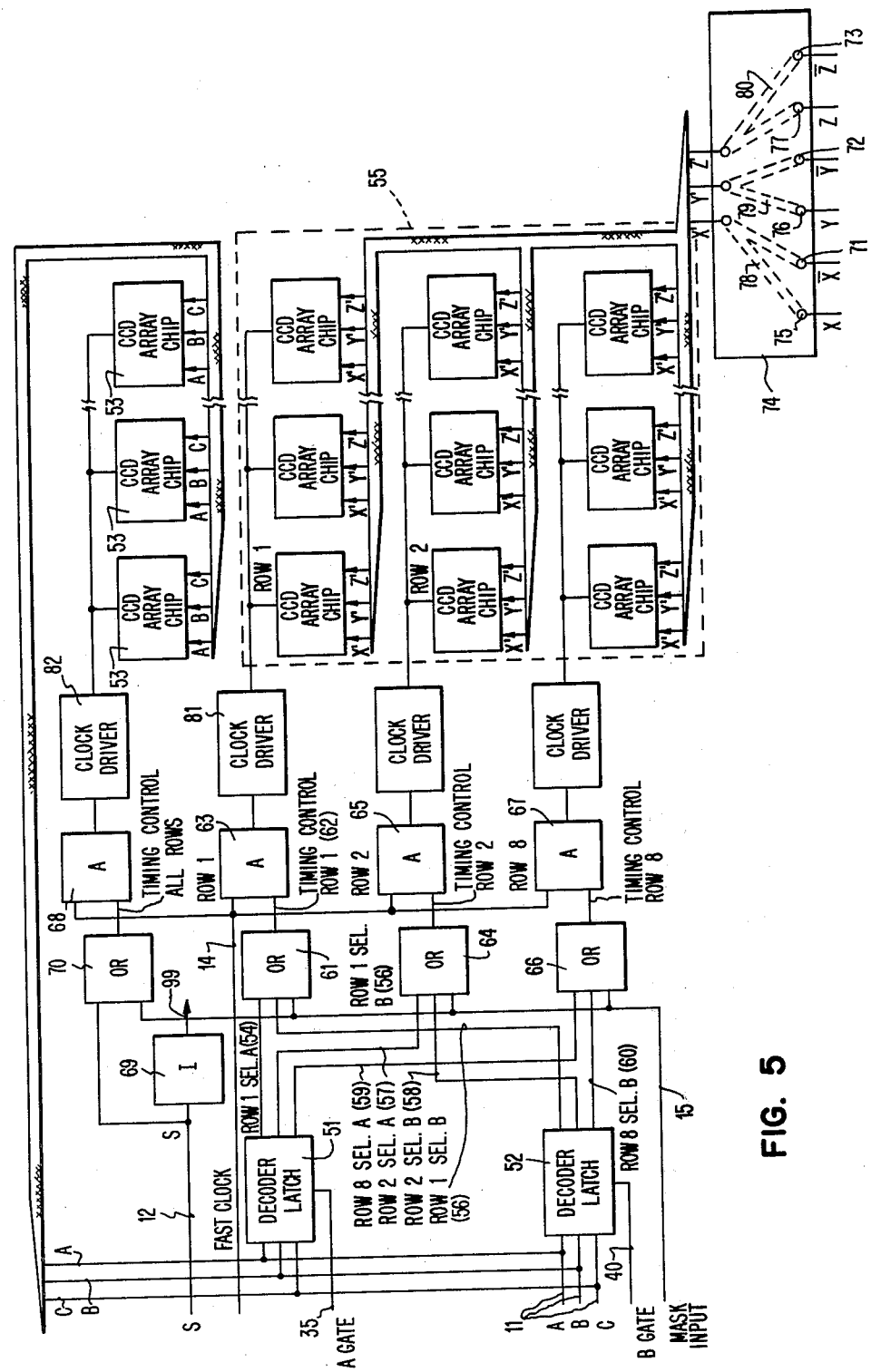
FIG. 5 is a simplified block diagram of the clock timing control for the memory array units of FIG. 1.

The clock timing control for the memory array units of FIG. 1 is shown in FIG. 5 along with chip address translation logic. For the sake of simplification and clarity of exposition, certain state-of-the-art details associated with data bussing and chip addressing, including the substitution of a row of "all good" chips in the event that a defective row of the "partially good" chips is addressed, have been omitted. Such details are well known in the prior art as exemplified, for example, in the aforementioned U.S. Pat. No. 3,845,476. Bits A, B and C from data bus 11 of FIGS. 1 and 2 are applied simultaneously to row decoder latches 51 and 52 and to the "all good" chips 53. The A gate on line 35 and the B gate on line 40 are applied to decoder latches 51 and 52, respectively. The A, B and C bits are latched up and then decoded in block 51 to apply a clock pulse gating signal to line 54 for the duration of the A gate in the event that row 1 of the "partially good" chips of the memory array portion 55 is being addressed. Similarly, the A, B and C bits are latched up and decoded in block 52 to produce a signal on line 56 during the occurrence of the B gate in the event that row 1 of memory array portion 55 is being addressed. Signals corresponding to those of lines 54 and 56 are produced on lines 57 and 58 in the event that row 2 of memory array portion 55 is being addressed. The same is true with respect to the signals produced on lines 59 and 60.

The signals on lines 54 and 56 are applied to OR circuit 61 along with the mask signal of line 15. The resulting output signal on line 62 is applied to row 1 AND gate 63 of memory array portion 55. In similar fashion, the signals on lines 57 and 58 are ORed (64) and applied to row 2 AND gate 65 while the signals on lines 59 and 60 are ORed (66) and applied to row 8 AND gate 67. Gates 65 and 67 also receive the mask signal of line 15 via their respective OR circuits 64 and 66. Eight rows are illustrated in memory array portion 55 by way of example only, consistent with the three row selection bits A, B and C of bus 11 of the disclosed embodiment.

Each of the row AND gates 63, 65 and 67, as well as the AND gate 68 associated with the "all good" chips 53 of the memory array also receive the fast clocking signals of line 14. The select signal, S, of line 12, indicating that a defective row portion of the "partially good" chips is being addressed, is directed to OR circuit 70 along with the mask signals of line 15 and are then applied to AND circuit 68 of the "all good" chip row. AND gates 63, 65 and 67 are rendered conductive only at the slow clocking rate in the event that a defective portion is being addressed inasmuch as neither the A nor B gate appears at OR circuits 61, 64 and 66 in that case. The octant selection signals for addressing the "partially good" chips of memory array portion 55 are represented by the $\overline{X}$, $\overline{Y}$ and $\overline{Z}$ signals on the respective lines of bus 11. Each of the X, Y and Z bit signals are inverted by complementing circuits (not shown) to provide the X, Y and Z signals applied to contacts 71, 72 and 73, respectively, of switches 74. The X, Y and Z signals are directed to the respective contacts 75, 76 and 77. The contacting arms 78, 79 and 80 are individually positioned so that the defective portions of the "partially good" chips are addressed by predetermined bit values, say, 111, for bits X, Y and Z. As previously mentioned, the chips comprising memory array portion 55 are tested, sorted and mounted so that the defective portion exists in the same chip areas for all chips mounted on a common memory array card.

In operation, row 1 AND gate 63, for example, passes fast clocking pulses to the row 1 clock driver 81 (if bits A, B and C designate row 1) during the time of the A gate and during the time of the B gate in the event that a defective octant is not being addressed by the X, Y and Z signals. The addressing of a defective octant causes the select signal of line 12 (applied by OR circuit 70) to condition AND gate 68 to pass the fast clocking pulses to driver 82 of the "all good" chip row.

All of the bit rows of chips 53 are clocked at the same fast clocking rate during the time that a defective octant of the "partially good" chips of array portion 55 is being addressed. However, only the addressed row of the chips within array portion 55 is clocked at a fast rate while A gate and B gate are present on lines 35 and 40, respectively. The unselected rows of the chips comprising memory array portion 55 are driven at a slow clocking rate inasmuch a row selection signals (of lines 54, 56, 57, 58, 59 and 60) are not applied to the OR circuits (61, 64 and 66) of the unselected rows. In such a case, the OR circuit for the unselected rows receives only the mask signal of line 15 which recurs at the slow clocking rate as previously stated. Consequently, the row AND gates (such as AND gate 63, 65 and 67) of the unselected rows are conditioned to pass only those fast clocks of line 14 which coincide with the mask signals on line 15 which are subharmonically related to the fast clock of line 14 at the slow clocking rate.

We claim:

1. In a two speed recirculating memory system utilizing rows of partially good components and a row of spare components, one of said spare components being substituted for a respective partially good component when the defective portion thereof is being addressed by an address signal, said signal comprising first bits representing component address and second bits representing portion address, all portions of said spare components, when addressed, being driven at a fast clock rate, addressed portions of said partially good components being driven at said fast clock rate and unaddressed portions of said partially good components being driven at a slow clock rate, means for detecting when a defective portion address is being invoked either solely in the current address or solely in the next pending address and for producing an inhibit signal upon that event, said inhibit signal preventing the next memory fetch until resynchronization has been achieved between the last accessed and the unaccessed recirculating memory components, said means for detecting comprising means for comparing said component address bits of said current and pending addresses and for producing a first signal when said component address bits of said current and pending addresses are the same, means responsive to said portion bits of said current address and for producing a second signal when said portion bits represent a defective portion, means responsive to said portion bits of said pending address and for producing a third signal when said portion bits represent a defective portion and means responsive to said first, second and third signals for producing said inhibit signal.

2. The apparatus defined in claim 1 and further including a pending address register and p1 a microprocessor controller for controlling the entry of said pending address into said register, said inhibit signal being applied to said controller to delay the entry of said pending address into said register.

3. The apparatus defined in claim 1 and further including means for generating a first row select signal during the time when a respective row of said partially good components is to be accessed, means for generating a second row select signal during the time when resynchronization is to be achieved between the last accessed memory component and the unaccessed memory components, means for inverting said second signal to produce a fourth signal, and means for blocking said row select signals upon application of said fourth signal.

4. The apparatus defined in claim 3 and further including a source of slow clock signals,
a source of fast clock signals, and
an AND gate for each row of said memory,
each said AND gate receiving said slow clock signals and said fast clock signals,
said first and second row select signals, being applied only to respective ones of said AND gates related to said partially good components.

5. The apparatus defined in claim 4 wherein said fourth signal is applied to one of said AND gates related to said all good components.

6. The apparatus defined in claim 5 wherein said second signal is applied to said one of said AND gates related to said all good components.

7. The apparatus defined in claim 1 and further including address translation means to change the address of said defective portions of said components to the same predetermined address.

8. The apparatus defined in claim 1 wherein said spare components are all good components.

* * * * *